(12) United States Patent
Sunohara (10) Patent No.: US 7,640,655 B2
(45) Date of Patent: Jan. 5, 2010

(54) ELECTRONIC COMPONENT EMBEDDED BOARD AND ITS MANUFACTURING METHOD

(75) Inventor: Masahiro Sunohara, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 300 days.

(21) Appl. No.: 11/519,125

(22) Filed: Sep. 12, 2006

(65) Prior Publication Data

US 2007/0056766 A1 Mar. 15, 2007

(30) Foreign Application Priority Data

Sep. 13, 2005 (JP) ............................ P2005-264746

(51) Int. Cl.
H05K 3/30 (2006.01)
(52) U.S. Cl. .................... 29/832; 174/258; 361/784; 29/830; 29/837; 29/841
(58) Field of Classification Search ................. 361/784; 174/258, 260, 256, 257; 29/832, 830, 837, 29/841, 842, 848
See application file for complete search history.

(56) References Cited

U.S. PATENT DOCUMENTS

| 5,432,677 | A | * | 7/1995 | Mowatt et al. | ............... | 361/719 |
| 6,025,648 | A | | 2/2000 | Takahashi et al. | | |
| 6,538,210 | B2 | * | 3/2003 | Sugaya et al. | ............... | 174/258 |
| 2004/0160752 | A1 | * | 8/2004 | Yamashita et al. | .......... | 361/766 |
| 2004/0168824 | A1 | * | 9/2004 | Sekido | ........................ | 174/256 |
| 2006/0042832 | A1 | * | 3/2006 | Sato et al. | .................... | 174/264 |

FOREIGN PATENT DOCUMENTS

| JP | 11-274734 | 10/1999 |
| JP | 2001-007472 | 1/2001 |

* cited by examiner

Primary Examiner—Dean A. Reichard
Assistant Examiner—Yuriy Semenenko
(74) Attorney, Agent, or Firm—Drinker Biddle & Reath LLP (57) ABSTRACT

A second substrate 12 is provided above a first substrate 11, and an electronic component 13 is arranged between the first substrate 11 and the second substrate 12 so that between the first substrate 11 and the second substrate 12, the electronic component 13 is sealed and a photosensitive resin 14 having adhesion is provided to bond the first substrate 11 and the second substrate 12 to each other.

5 Claims, 9 Drawing Sheets

ELECTRONIC COMPONENT EMBEDDED BOARD AND ITS MANUFACTURING METHOD

TECHNICAL FIELD

The present disclosure relates to a board embedding an electronic component (referred to as an electronic component embedded board) and its manufacturing method, and more particularly to an electronic component embedded board embedding an electronic component in a substrate having a multilayered wiring structure and its manufacturing method.

RELATED ART

In recent years, high density of an electronic component such as a semiconductor chip has greatly advanced, thereby downsizing the electronic component. Correspondingly, there has been proposed an electronic component embedded board embedding an electronic component in a substrate having a multilayered wiring structure in which a plurality of insulating layers, wirings and vias are stacked.

Figure 13:
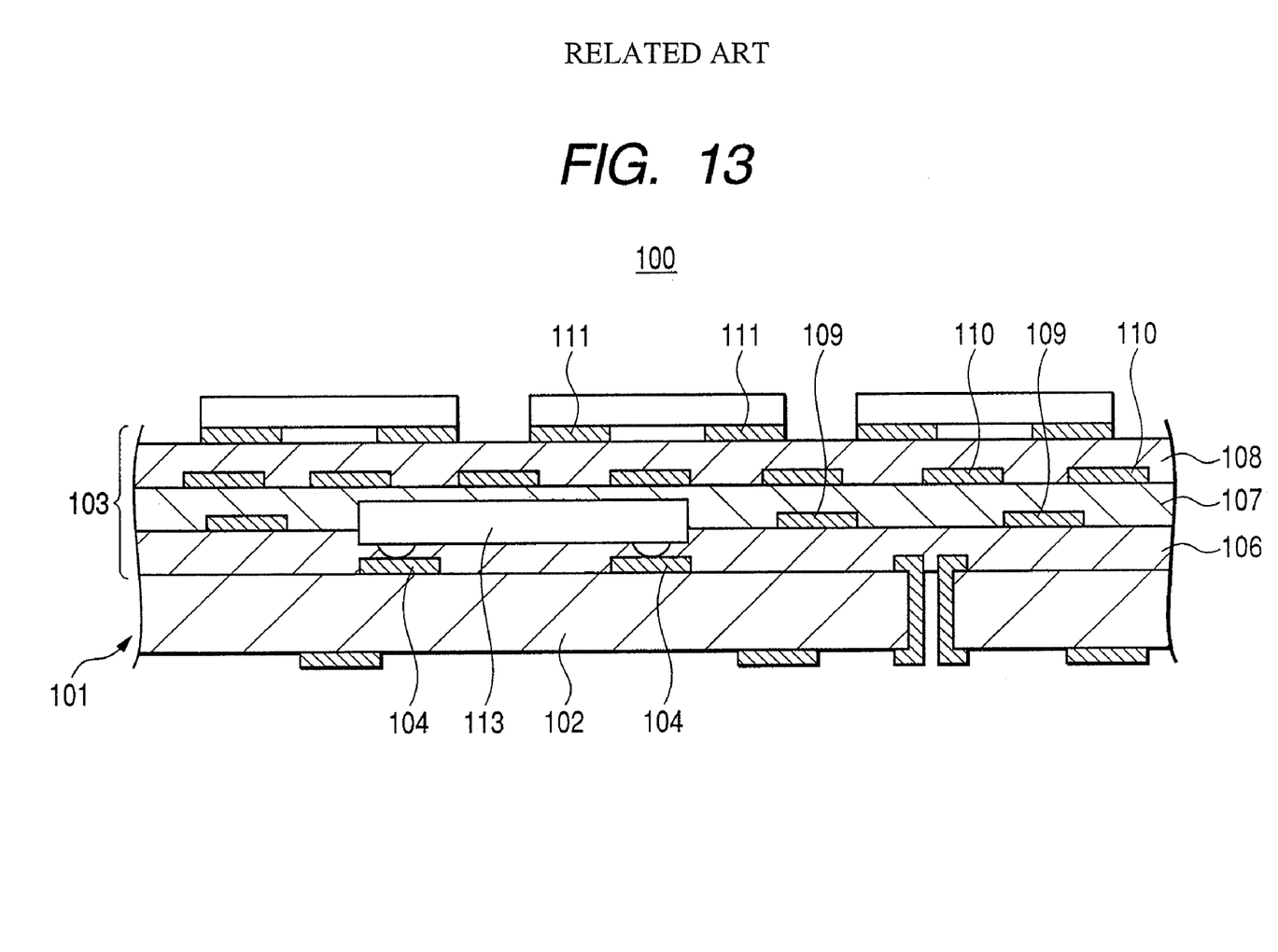
FIG. 13 is a sectional view of a related-art electronic component embedded board.

FIG. 13 is a sectional view of a related-art electronic component embedded board.

As shown in FIG. 13, an electronic component embedded board 100 includes a substrate 101 and an electronic component 113. The substrate 101 has a core substrate 102, wirings 104 provided on the core substrate 102 and a multilayered wiring structure 103.

The multilayered wiring structure 103 is formed on the core substrate 102 with the wirings 104. The multilayered wiring structure 103 includes insulating layers 106 to 108 stacked on the core substrate 102, wirings 109 to 111 formed on the insulating layers 106 to 108, respectively, and vias (not shown) made in the insulating layers and electrically connecting these wirings 109 to 111.

The electronic component 113 is formed on the wirings 104 and connected thereto. The electronic component 113 is covered with the insulating layers 106 and 107.

In the electronic component embedded board 100 having such a configuration, after the wirings 104 have been formed on the core substrate 102, the electronic component 113 is connected onto the wirings 104. Thereafter, the insulating layers 106 to 108, wirings 109 to 111 and vias (not shown), which constitute the multilayered wiring structure 103, are formed (for example, see Patent Reference 1: Japanese Patent Unexamined Publication No. Hei. 11-274734).

However, in a related-art electronic component embedded board 100, after the electronic component 113 has been connected to the wirings 104, the multiple-layer structure 103 is formed. Therefore, even where there is no problem in electric connection between the electronic component 113 and the wirings 104, if a malfunction (e.g. opening of the vias, or short-circuiting of the wirings) occurs in the wirings 109 to 111 and vias (not shown), the problem of reduction in the yield of the electronic component embedded board 100 was presented.

SUMMARY

Embodiments of the present invention provide an electronic component embedded board capable of improving the yield and a method for manufacturing the same.

According to an aspect of one or more embodiments of the invention, there is provided with an electronic component embedded board comprising: a first substrate having a first multi-layer wiring structure; a second substrate having a second multilayered wiring structure and being provided above the first substrate; an electronic component arranged between the first substrate and the second substrate; and a resin being arranged between the first substrate and the second substrate, and sealing the electronic component and bonding the first substrate and the second substrate to each other.

The resin may be a photosensitive resin having adhesion, underfill resin, nonconductive resin or anisotropic conductive resin.

In accordance with this invention, by providing a first substrate having a first multi-layer wiring structure, and a second substrate having a second multilayered wiring structure, before embedding an electronic component, an electric test for the first and the second multiple-layer structure can be made. Thus, since the electronic component can be embedded between the first and the second substrate which have been decided as being non-defective products, the yield of the electronic component embedded board can be improved.

By providing a photosensitive resin having adhesion between the first and the second substrate, the space between the first and the second substrates can be accurately sealed, thereby improving the yield.

By providing an underfill resin, nonconductive resin or anisotropic conductive resin, the commonly used resin and the commonly used production line can be used.

According to an aspect of one or more embodiments of the invention, there is provided a method for manufacturing an electronic component embedded board, comprising: a first step of forming a first substrate having a first multilayered wiring structure; a second step of forming a second substrate having a second multilayered wiring structure; a third step of electrically connecting an electronic component and the first multilayered wiring structure by bonding the electronic component to the first substrate using a first resin; a fourth step of forming a second resin so as to cover a surface of the first substrate with the electronic component arranged thereon and the electronic component; and a fifth step of arranging the second substrate above the first substrate by bonding the second substrate onto the second resin.

The resin may be a photosensitive resin having adhesion, nonconductive resin or anisotropic conductive resin.

According to another aspect of one or more embodiments of the invention, there is provided a method for manufacturing an electronic component embedded board, comprising: a first step of forming a first substrate having a first multilayered wiring structure; a second step of forming a second substrate having a second multilayered wiring structure; a third step of electrically connecting an electronic component and the first multilayered wiring structure; a fourth step of arranging the second substrate above the first substrate; and a fifth step of applying an underfill resin between the first substrate and the second substrate.

In accordance with this invention, after having provided a first substrate having a first multilayered wiring structure; and a second substrate having a second multilayered wiring structure, by making an electric test for the first and the second multiple-layer structures and embedding the electronic component between the first and the second substrate which have been decided as being non-defective products, the yield of the electronic component embedded board can be improved.

Further, by bonding the electronic component to the first substrate using the first photosensitive resin having adhesion, and forming a second photosensitive resin having adhesion so as to cover a surface of the first substrate with the electronic component arranged thereon and the electronic component, the space between the first and the second substrates can be accurately sealed, thereby improving the yield of the electronic component embedded board.

By providing an underfill resin, nonconductive resin or anisotropic conductive resin, the commonly used resin and the commonly used production line can be used.

Various implementations may include one or more the following advantages. For example, the yield of the electronic component embedded board can be improved.

Other features and advantages may be apparent from the following detailed description, the accompanying drawings and the claims.

DETAILED DESCRIPTION

Now referring to the drawings, an explanation will be given of various embodiments of this invention.

Embodiment 1

Figure 1:
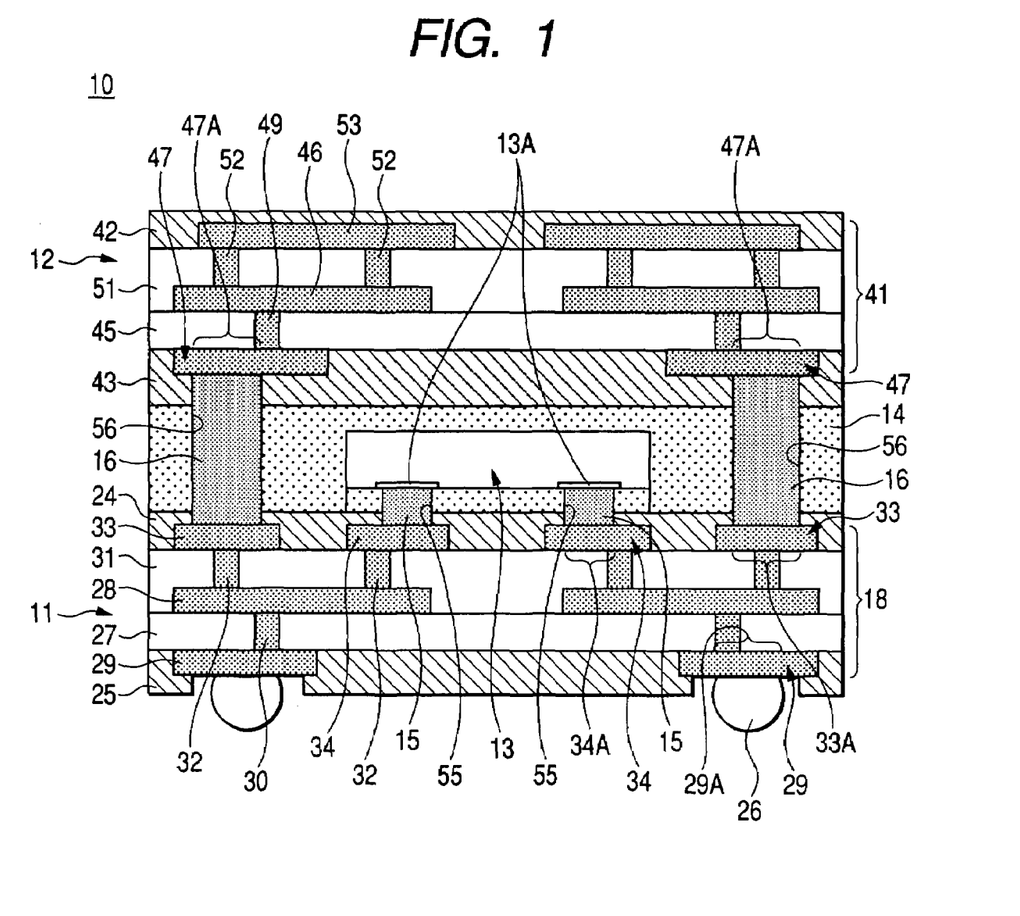
FIG. 1 is a sectional view of an electronic component embedded board according to the first embodiment of this invention.

FIG. 1 is a sectional view of an electronic component embedded board according to the first embodiment of this invention.

Referring to FIG. 1, an explanation will be given of an electronic component embedded board 10 according to the first embodiment of this invention. The electronic component embedded board 10 includes a first substrate 11, a second substrate 12, an electronic component 13, a photosensitive resin 14 and conductive members 15, 16.

The first substrate 11 is a coreless substrate which includes a first multilayered wiring structure 18, protective films 24, 25 and an external connecting terminal 26.

The first multilayered wiring structure 18 includes insulating layers 27, 31, wirings 28, 29, 33, 34 and vias 30, 32. The wirings 28 each are formed on the upper face of the insulating layer 27. The wiring 28 is electrically connected to the vias 30, 32. The wirings 29 each are formed on the lower face of the insulating layer 27. The wiring 29 has a connecting area 29A to which an external connecting terminal 26 is connected. The vias 30 each are formed to pass through the insulating layer 27. The upper end of the via 30 is connected to the wiring 28. The lower end of the via 30 is connected to the wiring 29. The via 30 electrically communicates the wirings 28 and 29.

The insulating layer 31 is formed on the insulating layer 27 so as to cover the wirings 28. The vias 32 each are formed so as to pass through the insulating layer 31 located on the wirings 28. The via 32 is electrically connected to the wiring 28. The wirings 33 each are formed on the upper face of the insulating layer 31. The wiring 33 is electrically connected to the via 32. The wiring 33 has a connecting area 33A to which the conductive member 16 is connected. The wirings 34 each are formed on the upper face of the insulating layer 31 located inside the wirings 33. The wirings 34 each have a connecting area 34A to which the conductive member 15 is connected. The wiring 34 is electrically connected to the via 32.

The insulating layers 27, 31 can be made of e.g. epoxy-series resin. The wirings 28, 29, 33, 34 and vias 30, 32 can be made of e.g. a conductive metal. A concrete example of the conductive metal to be used is Cu.

The protective film 24 is formed on the insulating layer 31 so as to cover the wirings 33, 34 and expose the connecting areas 33A, 34A. The protective film 25 is formed on the lower face of the insulating layer 27 so as to cover the wirings 29 and expose the connecting areas 29A. The protective films 24, 25 may be made of e.g. solder resist.

The external connecting terminal 26 is formed in the connecting area 29A. The external connecting terminal 26 is a terminal employed when the electronic component embedded board 10 is connected to a mounting board (not shown) such as a mother board. The external connecting terminal 26 may be made of e.g. a solder ball.

The first substrate 11 constructed as described above is a non-defective substrate for which it has been confirmed that the first multiple-layer structure 18 is free from the malfunction (e.g. opening of the vias, or short-circuiting of the wirings).

The second substrate 12 is arranged above the first substrate 11, and connected to the first substrate 11 through pillar-shaped conductive members 16. The second substrate 12 is a coreless substrate which includes a second multiple-layer structure 41 and protective films 42, 43.

The second multilayered wiring structure 41 includes insulating layers 45, 51, wirings 46, 47, 53, and vias 49, 52. The wirings 46 each are formed on the upper face of the insulating layer 45. The wiring 46 is electrically connected to the vias 49, 52. The wirings 47 each are formed on the lower face of the insulating layer 45. The wiring 47 has a connecting area 47A to which the conductive member 16 is connected. The connecting area 47A is connected to the connecting area 33A formed in the first substrate 11. Thus, the second multilayered wiring structure 41 formed in the second substrate 12 is electrically connected to the first multilayered wiring structure 18.

The vias 49 each are formed to pass through the insulating layer 45. The upper end of the via 49 is connected to the wiring 46. The lower end of the via 49 is connected to the wiring 47. The via 49 electrically communicates the wirings 46 and 47.

The insulating layer 51 is formed on the insulating layer 45 so as to cover the wirings 46. The vias 52 each are formed so as to pass through the insulating layer 51 located on the wirings 46. The via 52 electrically communicates the wirings 46 and 53. The wirings 53 each are formed on the upper face of the insulating layer 51. The wiring 53 is electrically connected to the via 52.

The insulating layers 45, 51 can be made of e.g. epoxy-series resin. The wirings 46, 47, 53 and vias 49, 52 can be made of e.g. a conductive metal. A concrete example of the conductive metal to be used is Cu.

The protective film 42 is formed on the insulating layer 51 so as to cover the wirings 53. The protective film 43 is formed on the lower face of the insulating layer 45 so as to cover the wirings 47 and expose the connecting areas 47A. The protective films 42, 43 may be made of e.g. solder resist.

The second substrate 12 constructed as described above is a non-defective substrate for which it has been confirmed that the second multiple-layer structure 41 is free from the malfunction (e.g. opening of the vias, or short-circuiting of the wirings).

The electronic component 13 is arranged between the first substrate 11 and the second substrate 12. The electronic component 13 has electrode pads 13A. The electrode pads 13A each are connected to the connecting area 34A through the conductive member 15. Thus, the electronic component 13 is electrically connected to the first multilayered wiring structure 18. The electronic component may be a chip component (single unit component such as a resistor or capacitor made with a very small size).

The photosensitive resin 14 is provided between the first substrate 11 and the second substrate 12. The photosensitive resin 14 is a photosensitive resin having adhesion (capable of keeping adhesion) even after it has been subjected to exposure and development processing. The photosensitive resin 14 seals the electronic component 13 and also bonds the first substrate 11 and the second substrate 12 to each other. In addition, the photosensitive resin 14 serves to reduce the difference in the thermal expansion coefficient between the first substrate 11 and the second substrate 12 and the difference in the thermal expansion coefficient between the first substrate 11 and the electronic component 13, thereby preventing the first substrate 11, second substrate 12 and electronic component 13 from being broken.

The photosensitive resin 14 has openings 55 and through holes 56. The openings 55 each are formed in the photosensitive resin 14 on the connecting area 34A. The opening 55 exposes the connecting area 34A. The through holes 56 each are formed so as to pass through the photosensitive resin 14 located between the connecting area 33A and the connecting area 47A. The through hole 56 exposes the connecting areas 33A, 47A. The through hole 56 is pillar-shaped (e.g. square pillar, cylindrical pillar).

In this way, by providing the photosensitive resin 14 having adhesion between the first substrate 11 and the second substrate 12, the space between the first substrate 11 and the second substrate 12 is accurately sealed so that the yield of the electronic component embedded board 10 can be increased.

The photosensitive resin 14 having adhesion may be e.g. a photosensitive resin film which is a filmy photosensitive resin. The photosensitive resin film may be made of e.g. epoxy resin or novolac resin doped with a photoreaction initiator.

The conductive member 15 is formed in the opening 55. The conductive member 15 electrically communicates the electrode pad 13A with the connecting area 34A. The conductive member 15 electrically communicates the electronic component 13 with the first multilayered wiring structure 18. The conductive member 15 may be made of a conductive material. A concrete example of the conductive material is e.g. solder.

The conductive members 16 each are pillar-shaped (e.g. square pillar or cylindrical pillar) and formed in the through hole 56. The conductive member 16 electrically communicates the connecting area 33A with the connecting area 47A. The conductive member 16 is a member for electrically connecting the first multilayered wiring structure 18 and the second multilayered wiring structure 41 to each other. The conductive member 16 may be made of e.g. solder, or a laminated film composed of Cu, Ni, Au and solder successively stacked on the connecting area 47A.

As described above, by providing the pillar-shaped conductive members 16 between the first substrate 11 and the second substrate 12 so that the first substrate 11 and the second substrate 12 are electrically connected to each other through the conductive members. 16, the height of the conductive members 16 can be changed according to the electronic component 13. Thus, various electronic components 13 can be embedded.

In accordance with the electronic component embedded board according to this invention, by providing the first substrate 11 having the first multilayered wiring structure 18; and the second substrate 12 having the second multilayered wiring structure 41, before embedding the electronic component 13, the electric test for the first and the second multiple-layer structures 18, 41 can be made. Thus, since the electronic component 13 can be embedded between the first and the second substrates 11, 12 which have been decided as being non-defective products, the yield of the electronic component embedded board 10 can be improved.

By providing the photosensitive resin 14 having adhesion between the first and the second substrates 11, 12, the space between the first and the second substrates 11, 12 can be accurately sealed, thereby improving the yield.

FIGS. 2 to 11 are views showing a manufacturing process of the electronic component embedded board according to the first embodiment of this invention. In FIGS. 2 to 11, like reference symbols refer to like constituent portions in the electronic component embedded-board 10 shown in FIG. 1.

Figure 2:
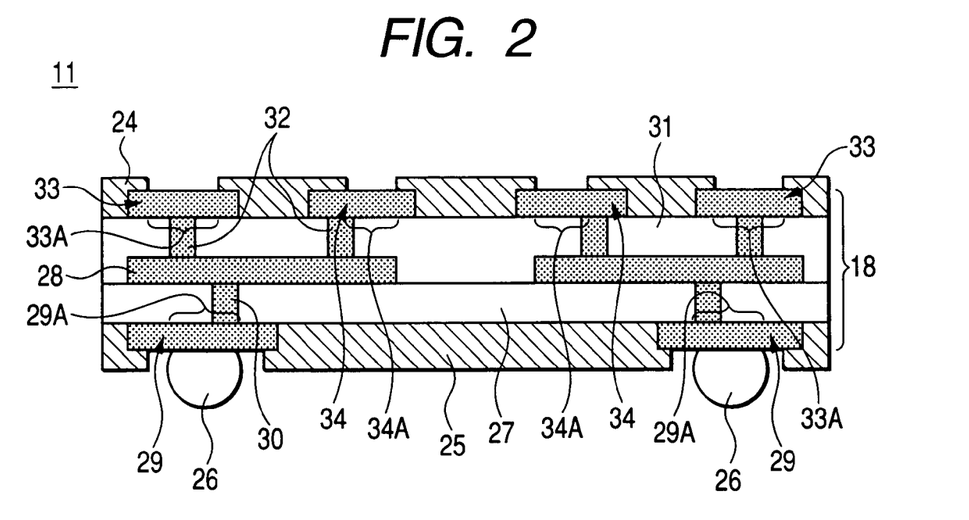
FIG. 2 is a view showing the process of manufacturing an electronic component embedded board according to the first embodiment of this invention (first step).

First, as shown in FIG. 2, using a known technique, the first substrate 11 is formed which includes the first multilayered wiring structure 18, protective films 24, 25, and external connecting terminals 26 (first step in claim). Thereafter, an electric test is made for the first substrate 11 with the first multilayered wiring structure 18, thereby providing the first substrate 11 which is a non-defective product.

Figure 3:
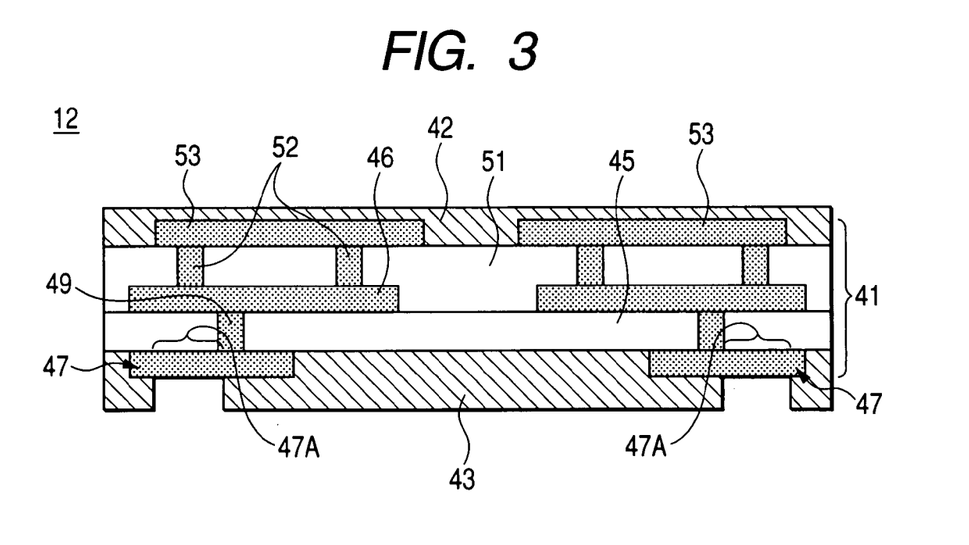
FIG. 3 is a view showing the process of manufacturing an electronic component embedded board according to the first embodiment of this invention (second step).

Next, as shown in FIG. 3, the second substrate 12 is formed which includes the second multilayered wiring structure 41 and protective films 42, 43 (second step in claim). Thereafter, an electric test is made for the second substrate 12 with the second multilayered wiring structure 41, thereby providing the second substrate 12 which is a non-defective product.

Figure 4:
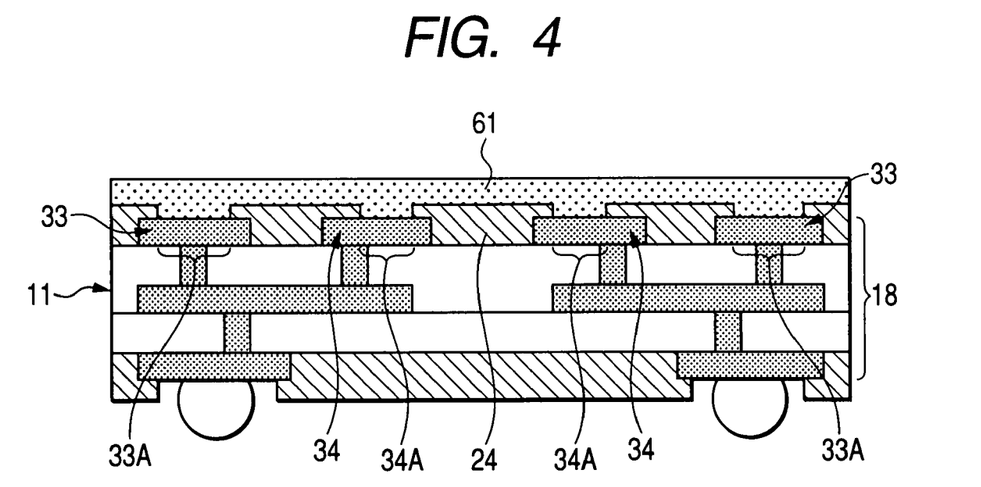
FIG. 4 is a view showing the process of manufacturing an electronic component embedded board according to the first embodiment of this invention (third step).

Next, as shown in FIG. 4, a first photosensitive resin 61 having adhesion is formed so as to cover the upper face of the first substrate 11 (the face on the side where the protective film 24 and the connecting areas 33A, 34A are formed). Concretely, as the first photosensitive resin 61, the photosensitive resin film having adhesion is affixed to the upper face of the first substrate 11. The photosensitive resin film may be made of e.g. epoxy resin or novolac resin doped with a photoreaction initiator. The photosensitive resin film can have a thickness of e.g. 30 μm to 50 μm. The first photosensitive resin 61 is a photosensitive resin having adhesion (capable of keeping adhesion) even after it has been subjected to exposure and development processing.

In this way, by using the photosensitive resin film having adhesion as the first photosensitive resin 61, the first photosensitive resin 61 can be easily formed as compared with the case where a liquid photosensitive resin having adhesion is used.

Figure 5:
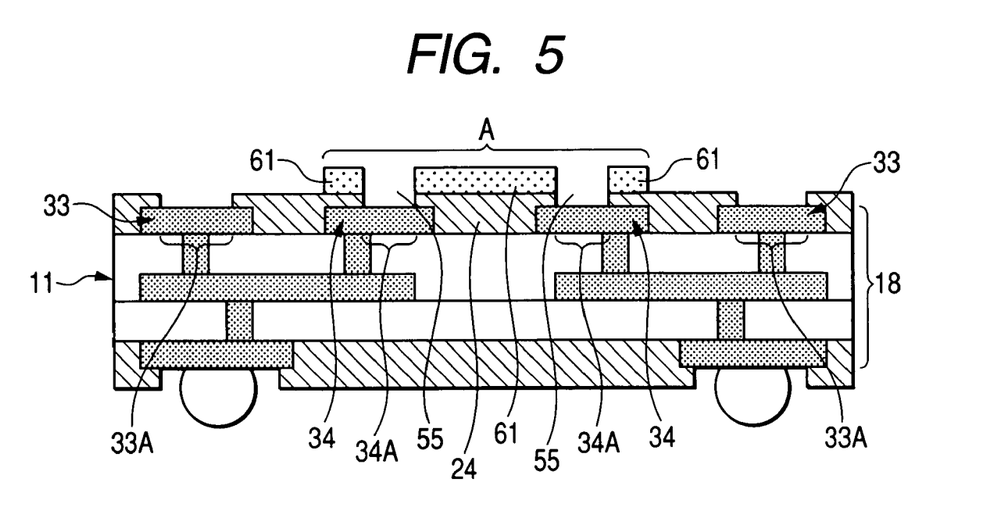
FIG. 5 is a view showing the process of manufacturing an electronic component embedded board according to the first embodiment of this invention (fourth step).

Next, as shown in FIG. 5, the first photosensitive resin 61 is subjected to exposure and development processing to form the openings 55 exposing the connecting areas 34A and remove the first photosensitive resin 61 formed on the area other than an electronic component arranging region A. The electronic component arranging area A refers to a region on the first photosensitive resin 61 in contact with the electronic component 13.

Figure 6:
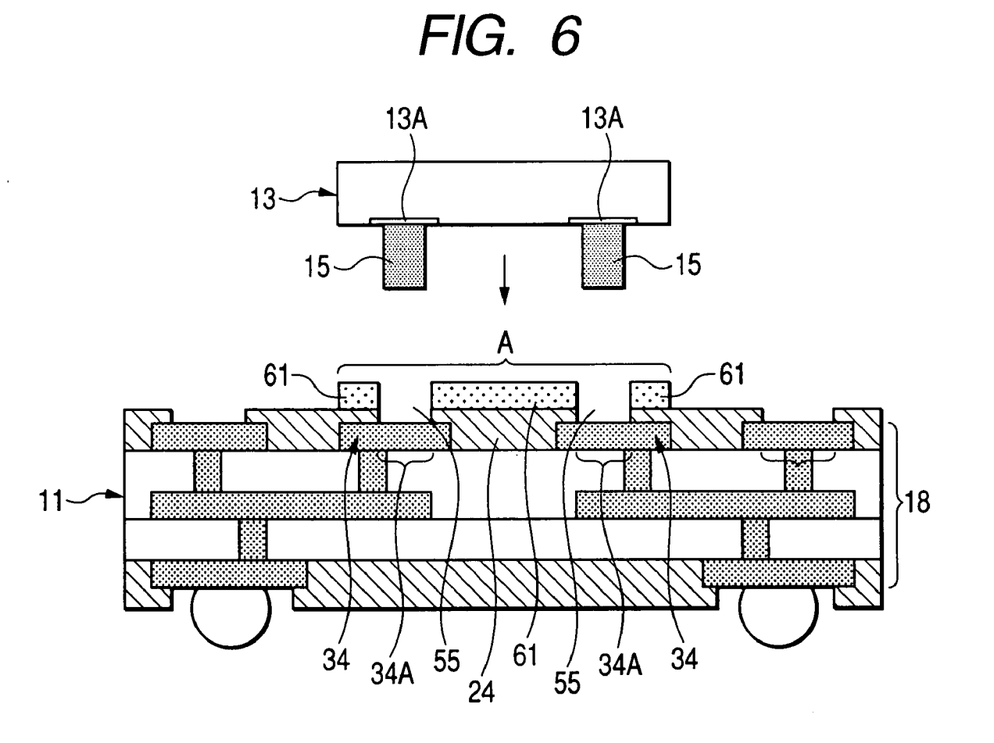
FIG. 6 is a view showing the process of manufacturing an electronic component embedded board according to the first. embodiment of this invention (fifth step).

Next, as shown in FIG. 6, the conductive members 15 are formed on the electrode pads 13A of the electronic component 13. Concretely, pillar-shaped solders are formed on the electrode pads 13A of the electronic component 13.

Figure 7:
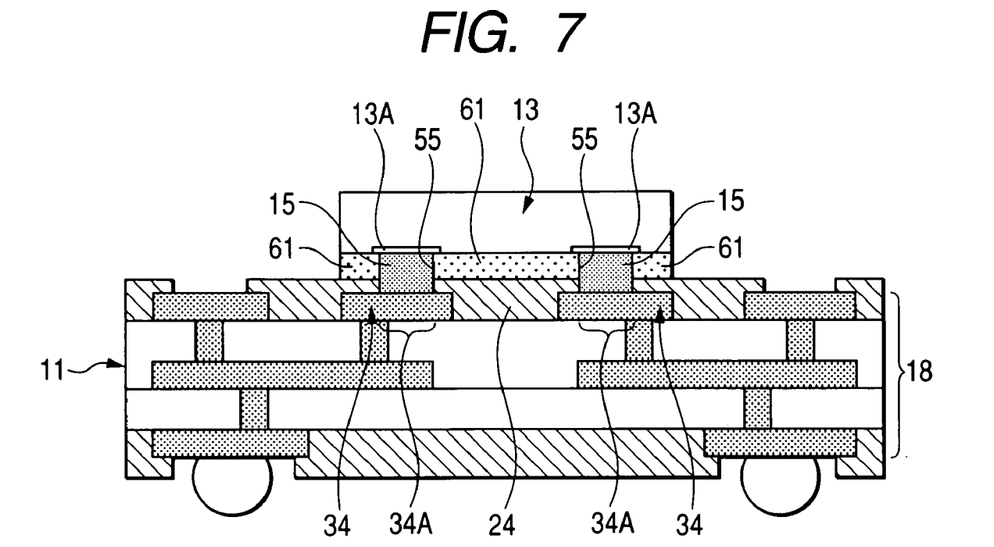
FIG. 7 is a view showing the process of manufacturing an electronic component embedded board according to the first embodiment of this invention (sixth step).

Next, as shown in FIG. 7, the electronic component 13 is bonded to the first photosensitive resin 61 having adhesion. In addition, with the conductive members 15 being inserted in the openings 55, by heating, the conductive members 15 are molten to connect the conductive members 15 to the connecting areas 34A (third step in claim). Thus, the electronic component 13 is electrically connected to the first multiple-layer structure 18. The heating condition in melting the conductive members 15 can be set as the temperature of 230 to 250° C. and the heating time of about several seconds to 10 seconds.

Figure 8:
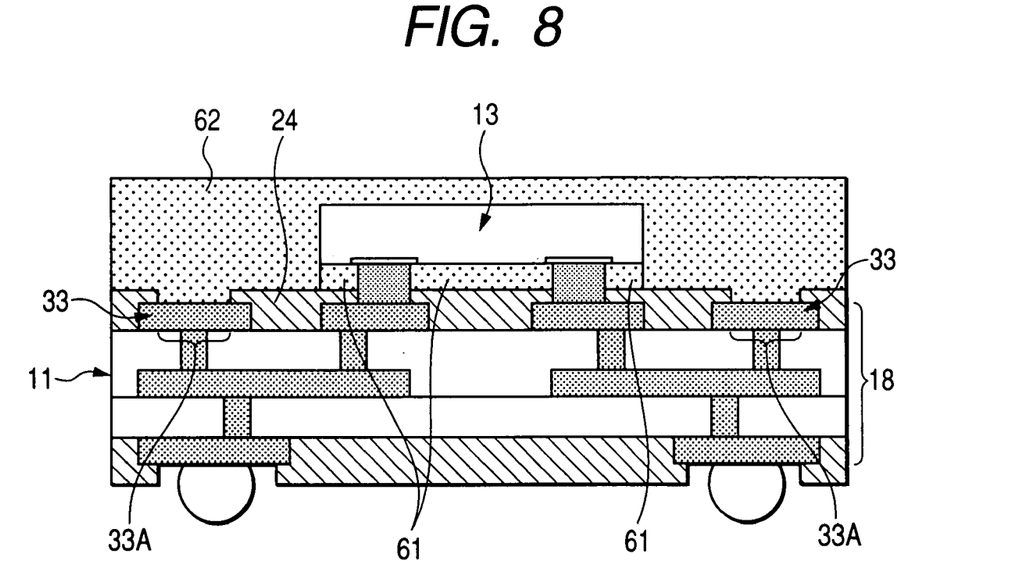
FIG. 8 is a view showing the process of manufacturing an electronic component embedded board according to the first embodiment of this invention (seventh step).

Next, as shown in FIG. 8, a second photosensitive resin 62 having adhesion is formed so as to cover the upper face of the structure shown in FIG. 7 (fourth step in claim). Concretely, as the second photosensitive resin 62, the photosensitive resin film is affixed to the upper face of the structure of the structure shown in FIG. 7. The photosensitive resin film may be made of e.g. epoxy resin or novolac resin doped with a photo initiator. The thickness of the photosensitive resin film may be 100 μm in the case where the thickness of the electronic component 13 is 50 μm.

The second photosensitive resin 62 is a photosensitive resin having adhesion (capable of keeping adhesion) even after it has been subjected to exposure and development processing. Further, after the photosensitive resin film has been affixed, a plate having a flat plane may be pressed on the upper face of the photosensitive resin film to make the upper face of the photosensitive resin film flat.

In this way, by using the photosensitive resin film having adhesion as the second photosensitive resin 62, the second photosensitive resin 62 can be easily formed as compared with the case where a liquid photosensitive resin having adhesion is used.

Figure 9:
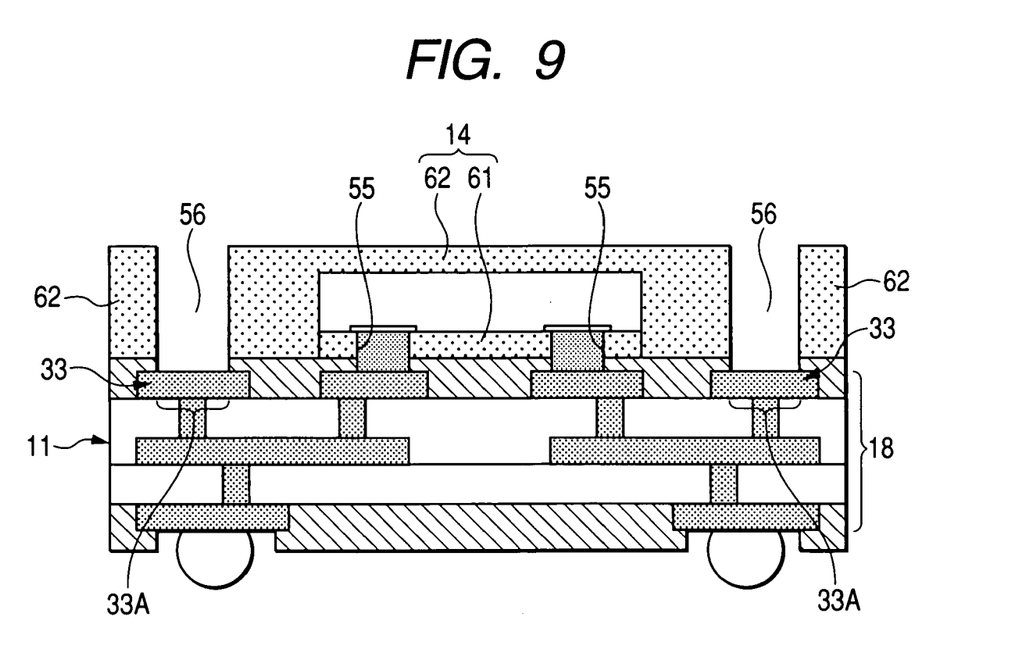
FIG. 9 is a view showing the process of manufacturing an electronic component embedded board according to the first embodiment of this invention (eighth step).

Next, as shown in FIG. 9, the second photosensitive resin 62 is subjected to exposure and development processing to form the through holes 56 exposing the connecting areas 33A. Thus, the first photosensitive resin 61 having the openings 55 and the second photosensitive resin 62 having the through holes 56 are formed.

Figure 10:
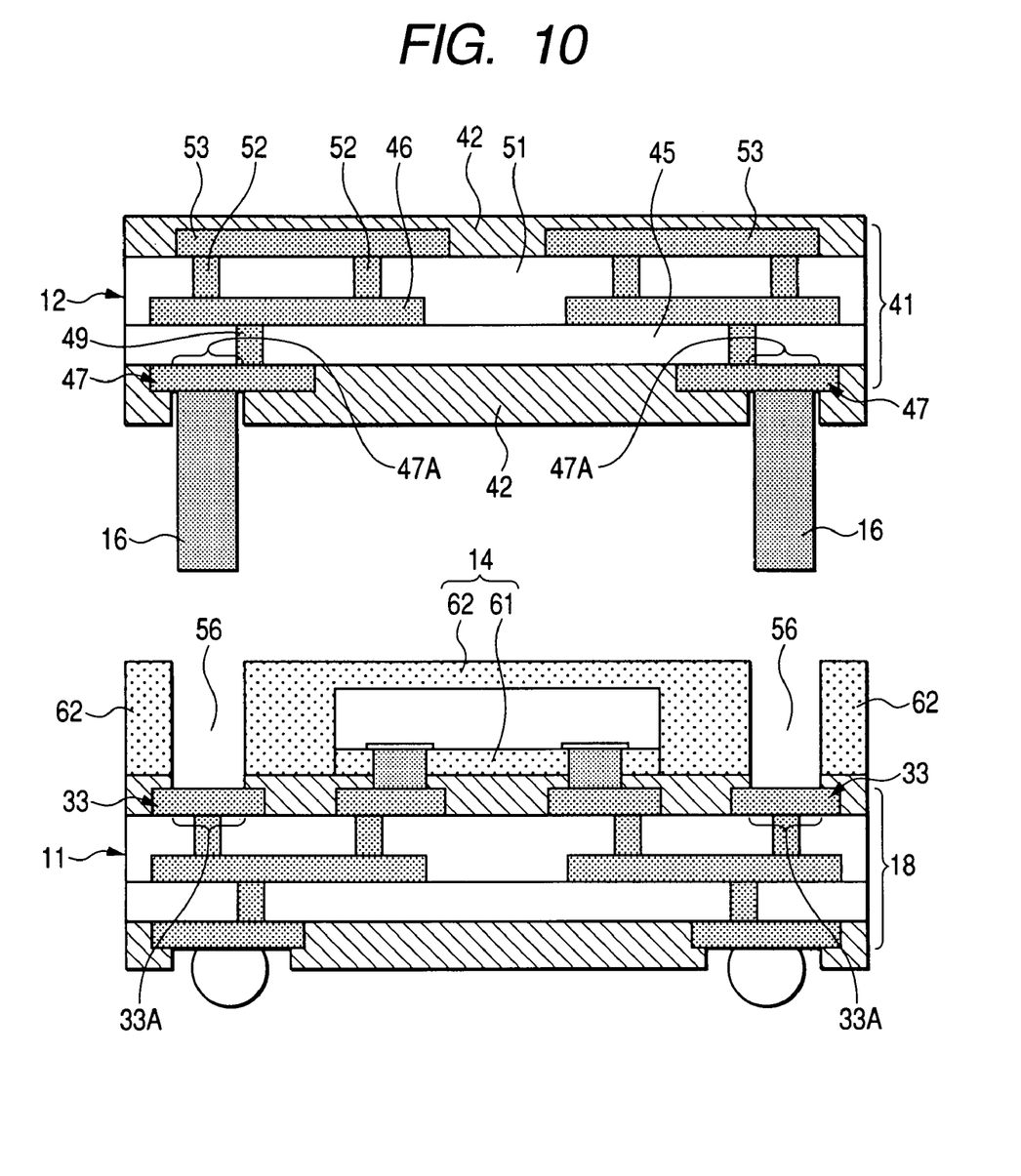
FIG. 10 is a view showing the process of manufacturing an electronic component embedded board according to the first embodiment of this invention (ninth step).

Next, as shown in FIG. 10, the conductive members 16 are formed in the connecting areas 47A of the second substrate 12 (conductive member forming step). Concretely, in the connecting area 47A of the second substrate 12, as the conductive members 16, the solder or a laminated film composed of Cu, Ni, Au and solder successively stacked on the connecting area 47A is formed. Cu, Ni and Au constituting the laminated film can be formed by plating, respectively.

Figure 11:
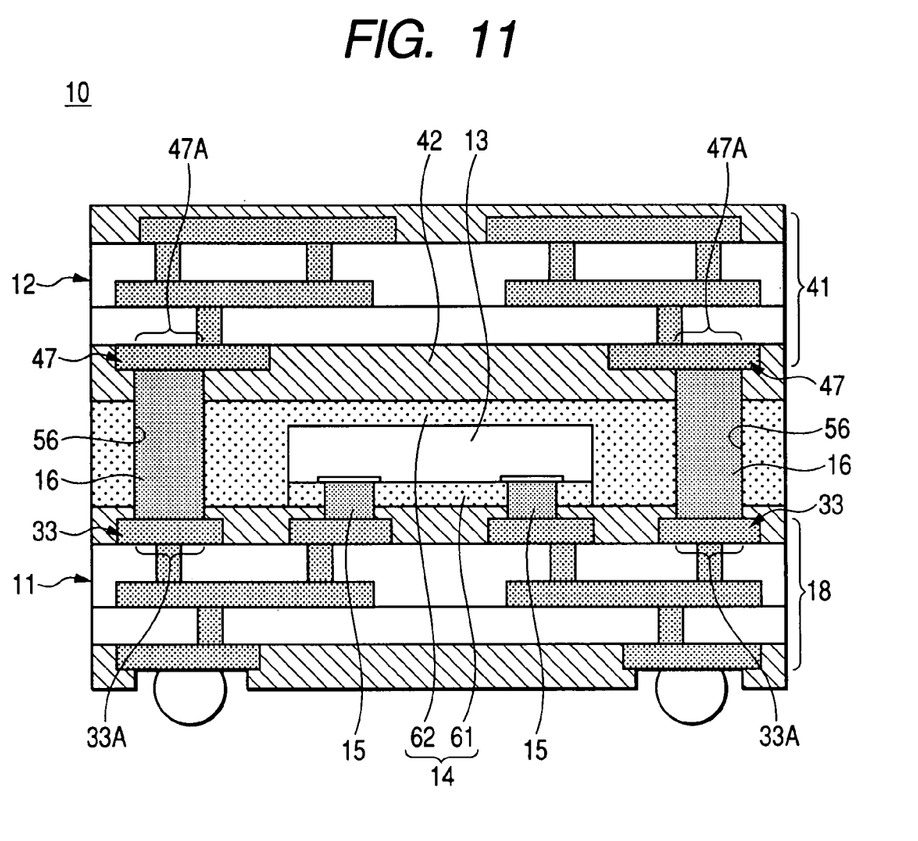
FIG. 11 is a view showing the process of manufacturing an electronic component embedded board according to the first embodiment of this invention (tenth step).

Next, as shown in FIG. 11, the second substrate 12 is bonded to the second photosensitive resin 62 having adhesion. In addition, with the conductive members 16 being inserted in the through holes 56, by heating, the conductive members 16 are molten to connect the conductive members 16 to the connecting areas 33A (fifth step in claim). Thus, the second multilayered wiring structure 41 is electrically connected to the first multilayered wiring structure 18, thus completing the electronic component embedded board 10. The heating condition in melting the solder of the conductive members 16 can be set as for example, the temperature of 230 to 250° C. and the heating time of about several seconds to 10 seconds.

In accordance with the method for manufacturing an electronic component embedded board, after having provided the first substrate 11 having the first multi-layer wiring structure 18, and the second substrate 12 having the second multilayered wiring structure 41, by making an electric test for the first and the second substrates 11, 12 and embedding the electronic component between the first and the second substrates 11, 12 which have been decided as being non-defective products, the yield of the electronic component embedded board 10 can be improved.

Further, by using the photosensitive resin 14 having adhesion, for example, the space between the first substrate 11 and the second substrate 12 can be accurately sealed as compared with the case where an underfill resin is formed between the first substrate and the second substrate by capillary phenomenon. Thus, the yield of the electronic component embedded board 10 can be improved.

Further, even where the size (area) in a surface-direction of the first and the second substrates 11, 12 is large, the space between the first substrate 11 and the second substrate 12 can be accurately sealed. Further, by using the photosensitive resin film as the photosensitive resin 14 having adhesion, the photosensitive resin 14 can be easily formed in a short time.

In this embodiment, the concrete example of the photosensitive resin 14 was explained as an example using the photosensitive resin film. However, in place of the photosensitive resin film, the liquid photosensitive resin having adhesion may be applied. The liquid photosensitive resin can be formed by e.g. spin coating.

Further, in this embodiment, the photosensitive resin having adhesion was explained as an example of the resin sealing the electric component and bonding the first substrate and the second substrate to each other. However, in place of the photosensitive resin having adhesion, a nonconductive resin or an anisotropic conductive resin may be applied. The nonconductive resin or the anisotropic conductive resin may be e.g. NCF(nonconductive film), NCP(nonconductive paste), ACF (anisotropic conductive film) or ACP(anisotropic conductive paste).

In a case of using the nonconductive resin or anisotropic conductive resin, the processes in FIGS. 5 and 9, i.e., the processes of making the openings 55 and throughholes 56 in the first and second resins may be omitted. More specifically, the electric component 13 with the conductive member 15 is pressed against the first resin applied on the first substrate 11 so that the conductive member 15 passes through the first resin and then connects to the connecting areas 34A, and then the first resin is cured. Similarly, the second substrate 12 with the conductive member 16 is pressed against the second resin applied on the structure as shown in FIG. 7 so that the conductive member 16 passes through the second resin and then connects to the connecting areas 33A, and then the second resin is cured.

Further, in place of the photosensitive resin having adhesion, an underfill resin may be applied between the first substrate 11 and the second substrate 12 by capillary phenomenon. The underfill resin may be made of e.g. epoxy resin. In a case of using the underfill resin, the underfill resin is applied between the first substrate 11 and the second substrate 12 in a state that the electronic component 13 with the conductive member 15 and the second substrate 12 with the conductive member 16 are provided on the first substrate 11, and then the underfill resin is cured.

By using NCF, NCP, ACF, ACP or underfill resin, in place of the photosensitive resin having adhesion, the commonly used resin or commonly used production line can be used.

In this embodiment, the first and the second substrates 11, 12 were explained as an example using the coreless substrates. However, wiring boards having core substrates may be employed as the first and the second substrates 11, 12. In this case also, the same effect as in this embodiment can be obtained.

Embodiment 2

Figure 12:
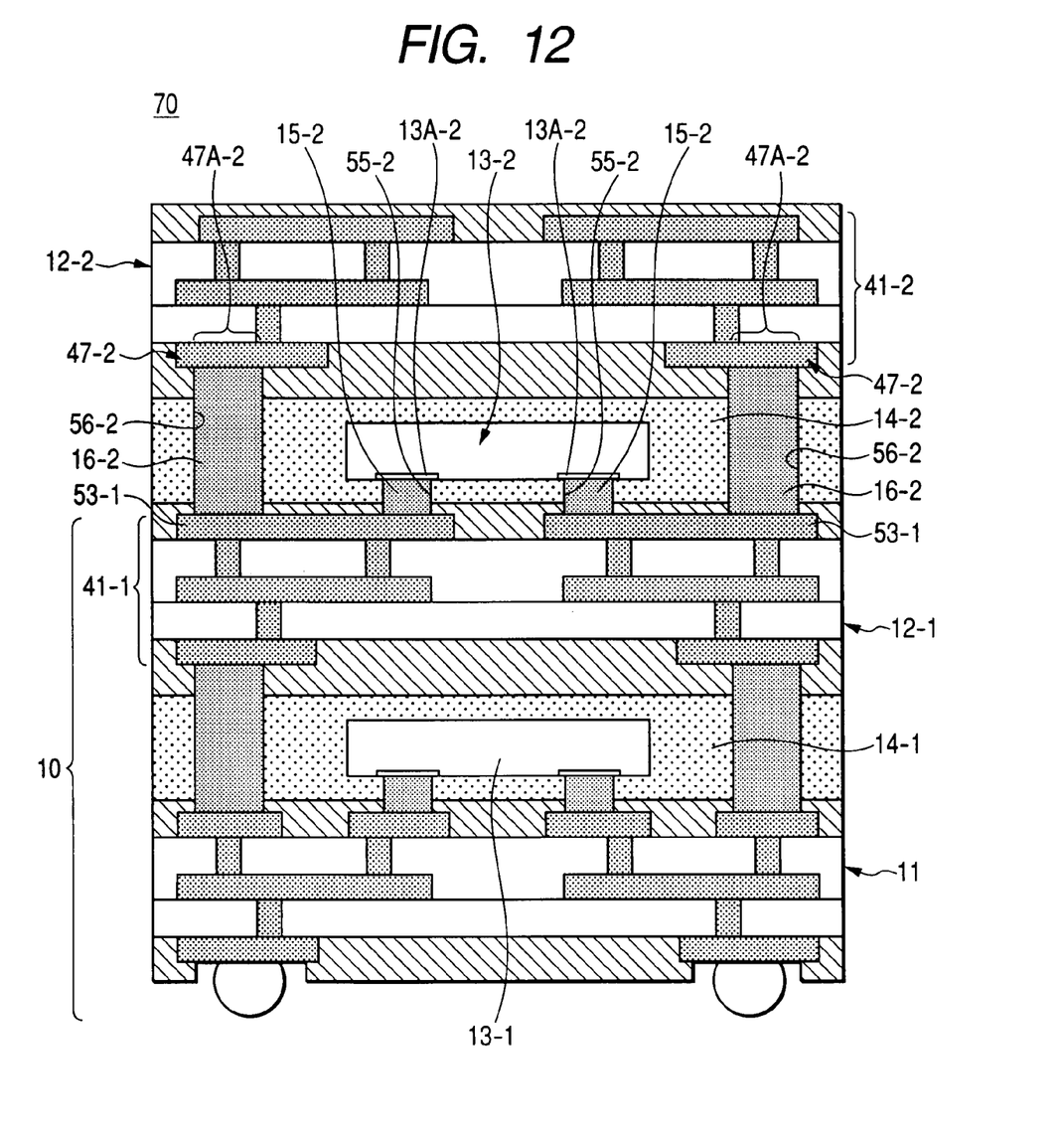
FIG. 12 is a sectional view of an electronic component embedded board according to the second embodiment of this invention

FIG. 12 is a sectional view of the electronic component embedded board according to the second embodiment of this invention. In FIG. 12, like reference symbols refer to like constituent portions in the electronic component embedded board 10 according to the first embodiment. Incidentally, in FIG. 12, for convenience for explanation, the reference symbols for constituent elements in the electronic component embedded board 10 are given "–1", and the reference symbols for the constituent elements of the structure provided on the electronic component embedded board 10 are given "–2".

As shown in FIG. 12, an electronic component embedded board 70 further includes, on the electronic component embedded board 10 explained in the first embodiment, a second substrate 12-2, an electronic component 13-2, a photosensitive resin 14-2 having adhesion, and conductive members 15-2, 16-2.

The second substrate 12-2 is arranged above the second substrate 12-1 and has a second multilayered wiring structure 41-2. The second multilayered wiring structure 41-2 is electrically connected to the second multilayered wiring structure 41-1 of the second substrate 12-1 through the pillar-shaped conductive members 16-2.

The electronic component 13-2 is arranged between the second substrate 12-1 and the second substrate 12-2. The electronic component 13-2 has electrode pads 13A-2. The electrode pads 13A-2 are electrically connected to wirings 53-1 through the conductive members 15-2, respectively. Thus, the electronic component 13-2 is electrically connected to the second multilayered wiring structure 41-1.

The photosensitive resin 14-2 is arranged between the second substrate 12-1 and the second substrate 12-2. The photosensitive resin 14-2 seals the electronic component 13-2 and also bonds the second substrate 12-1 and the second substrate 12-2 to each other. The photosensitive resin 14-2 has openings 55-2 and through holes 56-2. The openings 55-2 and the through holes 56-2 are made in the photosensitive resin 14-2 formed on the wirings 53-1. The openings 55-2 each expose the wiring 53-1 and the through holes 56-2 each expose the wring 53-1 and a connecting area 47A-2.

The conductive member 15-2 is formed in the opening 55-2, and electrically communicates the electrode pad 13A-2 with the wiring 53-1. The conductive member 16-2 is formed in the through hole 56-2 and electrically communicates the wiring 53-1 with the connecting area 47A-2.

As described above, also in the electronic component embedded board 70 in which three substrates 11, 12-1, 12-2 are stacked so that the electronic components 13-1, 13-2 are arranged between the substrates adjacent to each other in a vertical direction (in this embodiment, between the first substrate 11 and the second substrate 12-1 and between the second substrate 12-1 and the second substrate 12-2) and the substrates adjacent to each other in the vertical direction are bonded by the photosensitive resins 14-1, 14-2 having adhesion, the same effect as in the electronic component embedded board 10 according to the first embodiment can be obtained.

In this embodiment, the case where the three substrates 11, 12-1, 12-2 are stacked was adopted. However, also in the electronic component embedded board in which three or more substrates are stacked so that the electronic components 13 are arranged between the substrates adjacent in the vertical direction and the substrates adjacent in the vertical direction are bonded by the photosensitive resins 14 having adhesion, the same effect as in the electronic component embedded board 10 can be obtained.

Further, in this embodiment, the photosensitive resin having adhesion was explained as an example of the resin sealing the electric component and bonding the first substrate and the second substrate to each other. However, in place of the photosensitive resin having adhesion, NCF, NCP, ACF, ACP or underfill resin can be used.

Further, the electronic component embedded board 70 can be manufactured in the same method as the method for manufacturing the electronic component embedded board 10 according to the first embodiment as described previously.

Hitherto, the preferred embodiments of this invention have been explained in detail, However, this invention should not be limited to these specific embodiments but may be modified or changed in various manners within a scope of the spirit of this invention described in claims.

This invention is applicable to the electronic component embedded board and its manufacturing method capable of the yield.

What is claimed is:

1. A method for manufacturing an electronic component embedded board, comprising:
    a first step of forming a first substrate having a first multilayered wiring structure;
    a second step of forming a second substrate having a second multilayered wiring structure and a pillar-shaped conductive member formed in connecting areas;
    a third step of electrically connecting an electronic component and said first multilayered wiring structure by bonding said electronic component to said first substrate using a first resin;
    a fourth step of forming a second resin so as to cover a surface of said first substrate with said electronic component arranged thereon and said electronic component; and
    a fifth step of arranging said second substrate above said first substrate by bonding said second substrate onto said second resin and connecting said first substrate and said second substrate with the pillar-shaped conductive member formed in said second substrate.

2. A method for manufacturing an electronic component embedded board according to claim 1, wherein the first and second resins are photosensitive resins having adhesion.

3. A method for manufacturing an electronic component embedded board according to claim 1, wherein the first and second resins are nonconductive resins or anisotopic conductive resins.

4. A method for manufacturing an electronic component embedded board according to claim 2, wherein said first and said second photosensitive resins are photosensitive resin films.

5. A method for manufacturing an electronic component embedded board, comprising:
- a first step of forming a first substrate having a first multilayered wiring structure;
- a second step of forming a second substrate having a second multilayered wiring structure;
- a third step of electrically connecting an electronic component and said first multilayered wiring structure;
- a fourth step of forming a pillar-shaped conductive member on the second substrate;
- after the fourth step, a fifth step of arranging said second substrate above said first substrate and connecting said first substrate and said second substrate with the pillar-shaped conductive member formed on said second substrate; and
- a sixth step of applying an underfill resin between the first substrate and the second substrate.

* * * * *